United States Patent
Ivey

(10) Patent No.: US 9,706,301 B1
(45) Date of Patent: Jul. 11, 2017

(54) AMPLIFIER-BASED MICROPHONE SHUTOFF SYSTEM

(71) Applicant: Mitek Corp., Inc., Phoenix, AZ (US)

(72) Inventor: Johnathan Ivey, Chandler, AZ (US)

( * ) Notice: Subject to any disclaimer, the term of this patent is extended or adjusted under 35 U.S.C. 154(b) by 0 days.

(21) Appl. No.: 15/351,908

(22) Filed: Nov. 15, 2016

(51) Int. Cl.
| H03G 11/00 | (2006.01) |
| H04R 3/00 | (2006.01) |
| H03F 3/183 | (2006.01) |
| H03F 1/52 | (2006.01) |

(52) U.S. Cl.
CPC .............. *H04R 3/007* (2013.01); *H03F 1/52* (2013.01); *H03F 3/183* (2013.01); *H04R 2410/03* (2013.01)

(58) Field of Classification Search
CPC ............ H04R 3/007; H03F 1/52; H03F 3/183
See application file for complete search history.

(56) References Cited

U.S. PATENT DOCUMENTS

| 4,246,573 | A | * | 1/1981 | Kiss | .................. | G08B 13/1409 |
| | | | | | | 340/426.18 |
| 4,905,290 | A | * | 2/1990 | Yaoita | ..................... | H04R 3/02 |
| | | | | | | 381/83 |
| 5,767,744 | A | * | 6/1998 | Irwin | ....................... | H03F 1/52 |
| | | | | | | 330/289 |
| 7,450,332 | B2 | | 11/2008 | Pasolini et al. | | |
| 8,676,532 | B2 | | 3/2014 | Shibata | | |
| 2007/0253087 | A1 | | 11/2007 | Lee | | |
| 2011/0182442 | A1 | * | 7/2011 | McDonald | ............ | H04H 60/04 |
| | | | | | | 381/109 |
| 2014/0241559 | A1 | | 8/2014 | Mulder | | |

* cited by examiner

*Primary Examiner* — Simon King
(74) *Attorney, Agent, or Firm* — Keith L. Jenkins, Registered Patent Attorney, LLC; Keith L. Jenkins

(57) ABSTRACT

An amplifier-resident device for protecting amplifiers and loudspeakers from shock transient audio signals from dropped microphones that may use either an amplifier control signal from the microphone or a sequential sampling of the incoming audio (optionally switchable) to determine if a microphone drop, or other shock transient, is occurring. If a shock transient is occurring, the device blocks audio signal access to the amplifier. The audio signal goes through a delay line to allow processing time for detecting a shock transient and switching the shock transient audio signal out of the path to the amplifier. The delay may be variable. The device may be integral to the amplifier or may plug into a microphone jack of the amplifier, allowing use with legacy amplifiers. In an embodiment, the device may store safe, predetermined audio signals to send to the amplifier during, and in place of, a shock transient.

20 Claims, 3 Drawing Sheets

AMPLIFIER-BASED MICROPHONE SHUTOFF SYSTEM

FIELD OF ART

The present invention relates to devices to protect amplifiers and loudspeakers from large audio signal transients. The present invention more particularly relates to a device to protect amplifiers and loudspeakers from large audio signal transients from a dropped microphone at the amplifier input.

BACKGROUND OF THE INVENTION

Microphone dropping has become a popular component of stage entertainment, but can cause serious damage to amplifiers and loudspeakers when the impact pulse from the dropped microphone reaches downstream electronic components.

SUMMARY OF THE INVENTION

Briefly described, the invention includes a circuit external to the microphone which monitors the incoming audio signal from the microphone and an incoming control signal from the microphone and shuts off the microphone audio if a transient is detected.

In an embodiment, the invention provides an amplifier-based microphone shutoff system including: a separator circuit that is either inside an amplifier housing or coupled to an exterior of the amplifier housing; and operable to separate an audio signal from a microphone from a second signal from the microphone; a detector circuit that is either inside the amplifier housing or attached to an exterior of the amplifier housing; operable to detect the second signal; and adapted to generate a shut off signal responsive to the second signal; a switch that is either inside the amplifier housing or attached to an exterior surface of the amplifier housing, respectively; and responsive to the shut off signal to shut off an audio signal path to an amplifier; and a delay circuit that is either inside the amplifier housing or attached to an exterior of the amplifier housing, respectively; operable to delay the audio signal for a duration greater than the cumulative time required for the separator, the detector, and the switch to operate. That amplifier-based microphone shutoff system, including the amplifier within the amplifier housing, where the amplifier provides an amplified audio output for driving a loudspeaker. That amplifier-based microphone shutoff system, where the second signal includes an amplifier control signal originating in the microphone. That amplifier-based microphone shutoff system, where the second signal includes a sequence of samples of the audio signal. That amplifier-based microphone shutoff system, where the detector circuit includes a demultiplexer. That amplifier-based microphone shutoff system, where the delay circuit includes a variable delay circuit. That amplifier-based microphone shutoff system, including a digital memory having a stored audio signal at a predetermined amplitude, where the switch is adapted, responsive to receiving the shutoff signal, to communicate the stored audio signal to the amplifier. That amplifier-based microphone shutoff system, where the separator circuit, the detector circuit, the switch, and the delay circuit comprise a single physical unit. That amplifier-based microphone shutoff system, where the single physical unit further includes: a shutoff circuit housing; a microphone plug extending from the shutoff circuit housing and adapted to plug into the amplifier housing; and a microphone socket supported on the shutoff circuit housing and adapted to receive a microphone plug that is coupled to the microphone. That amplifier-based microphone shutoff system, where the detector circuit includes a circuit switchable between a first mode adapted to respond to a microphone-generated amplifier control signal and a second mode adapted to respond to a sequence of samples of the audio signal.

An amplifier-based microphone shutoff system including: a separator circuit that is either inside an amplifier housing or coupled to an exterior of the amplifier housing, and operable to separate an audio signal from a microphone from a second signal from the microphone; a detector circuit that is either inside the amplifier housing or attached to an exterior of the amplifier housing; operable to detect the second signal; and adapted to generate a shut off signal responsive to the second signal; a switch that is either inside the amplifier housing or attached to an exterior of the amplifier housing, respectively; and responsive to the shut off signal to shut off an audio signal path to an amplifier; a delay circuit that is either inside the amplifier housing or attached to an exterior of the amplifier housing, respectively; and operable to delay the audio signal for a duration greater than the cumulative time required for the separator circuit, the detector circuit, and the switch to operate; and where the second signal includes either an amplifier control signal originating in the microphone or a sequence of samples of the audio signal. That amplifier-based microphone shutoff system, where the detector circuit includes a circuit switchable between a first mode, adapted to respond to a microphone generated amplifier control signal, and a second mode, adapted to respond to a sequence of samples of the audio signal. That amplifier-based microphone shutoff system, where the delay circuit includes a variable delay circuit. That amplifier-based microphone shutoff system, where the separator circuit, the detector circuit, the switch, and the delay circuit comprise a single physical unit. That amplifier-based microphone shutoff system, where the single physical unit further includes: a shutoff circuit housing; a microphone plug extending from the shutoff circuit housing and adapted to plug into the amplifier housing; and a microphone socket supported on the shutoff circuit housing and adapted to receive a microphone plug that is coupled to the microphone. That amplifier-based microphone shutoff system, including a digital memory having a stored audio signal at a predetermined amplitude, where the switch is adapted, responsive to receiving the shutoff signal, to communicate the stored audio signal to the amplifier. That amplifier-based microphone shutoff system, where the detector circuit includes a demultiplexer.

An amplifier-based microphone shutoff system including: a separator circuit that is either inside an amplifier housing or coupled to an exterior of the amplifier housing and operable to separate an audio signal from a microphone from a second signal from the microphone; a detector circuit that is either inside the amplifier housing or attached to an exterior of the amplifier housing; operable to detect the second signal; and adapted to generate a shut off signal responsive to the second signal; where the detector circuit includes a circuit switchable between a first mode adapted to respond to a microphone generated amplifier control signal and a second mode adapted to respond to a sequence of samples of the audio signal; a switch that is either inside the amplifier housing or attached to an exterior of the amplifier housing, respectively; and responsive to the shut off signal to shut off an audio signal path to an amplifier; a delay circuit that is either inside the amplifier housing or attached to an exterior of the amplifier housing, respectively and operable to delay the audio signal for a duration greater than the cumulative time required for the separator circuit, the detector circuit, and the switch to operate; where the delay circuit includes a variable delay circuit; and where the second signal includes an amplifier control signal originating in the microphone and/or a sequence of samples of the audio signal. That amplifier-based microphone shutoff system, where the separator circuit, the detector circuit, the switch, and the delay circuit comprise a single physical unit including: a shutoff circuit housing; a microphone plug extending from the shutoff circuit housing and adapted to plug into the amplifier housing; and a microphone socket supported on the shutoff circuit housing and adapted to receive a microphone plug that is coupled to the microphone that is coupled to the microphone. That amplifier-based microphone shutoff system, including a digital memory having a stored audio signal at a predetermined amplitude, where the switch is adapted, responsive to receiving the shutoff signal, to communicate the stored audio signal to the amplifier.

DESCRIPTION OF THE FIGURES OF THE DRAWINGS

The present invention will hereinafter be described in conjunction with the following drawing figures, wherein like numerals denote like elements.

DETAILED DESCRIPTION OF THE INVENTION

Figure 1:
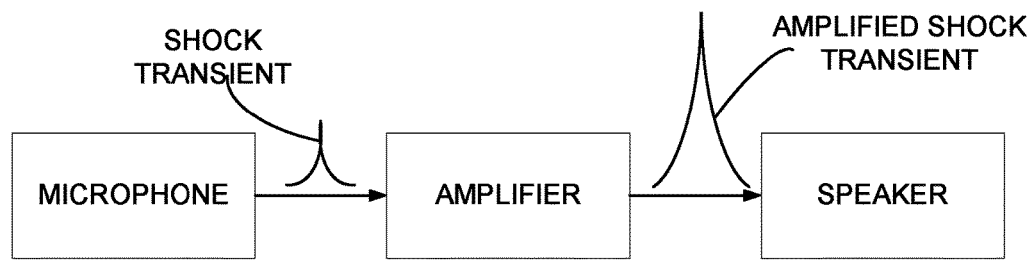
FIG. 1 is diagrammatic view illustrating a prior art embodiment of an audio system.

FIG. 1 is diagrammatic view illustrating a prior art embodiment of an audio system, consisting of a microphone providing an audio signal to an amplifier, which sends an amplified audio signal to a loudspeaker. When the microphone is dropped, a shock transient is generated by physical impulse acting on the microphone diaphragm, which sends a shock transient audio signal to the amplifier, causing damage or, being amplified, to the loudspeaker, causing damage to the loudspeaker.

Figure 2:
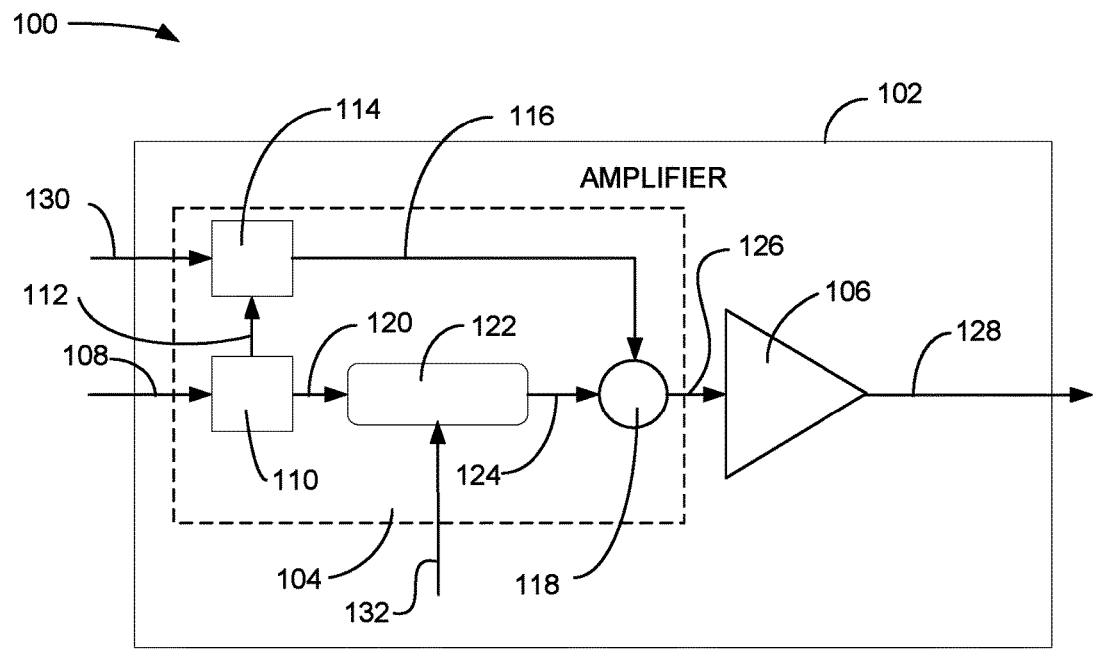
FIG. 2 is diagrammatic view illustrating an exemplary embodiment of the amplifier-based microphone shutoff system of FIG. 1, according to a preferred embodiment of the present invention.

FIG. 2 is diagrammatic view illustrating an exemplary embodiment of the amplifier-based microphone shutoff system 100, according to a preferred embodiment of the present invention. Amplifier 100 includes housing 102 which contains the shutoff circuit 104 and amplifier 106. In a particular embodiment, amplifier 106 may be a plurality of amplification stages. Shutoff circuit 104 receives an audio signal line 108 that carries both the audio signal and an amplifier control signal. Audio signal line 108 provides the audio and amplifier control signals to separator circuit 110 which separates the amplifier control signal from the audio signal and supplies the amplifier control signal to the detector circuit 114 via line 112. Separator 114 may be a demultiplexer or similarly effective device. In a particular embodiment, the amplifier control signal may be a DC signal and the audio signal may be separated on that basis. Detector circuit 114 determines, from the amplifier control signal, whether or not a microphone drop has occurred. If so, detector circuit 114 sends, via line 116, a switching signal to switch 118 to prevent the microphone drop transient from reaching the amplifier 106. Because the amplifier control signal generator in the microphone may require several samples to determine the presence of an audio spike from a dropped microphone, the amplifier control signal will lag behind the arrival of the pulse at the separator by a few milliseconds, and detection by detector circuit 114 requires additional time to process the amplifier control signal. Accordingly, when the audio signal leaves the separator 110, it is supplied to a delay line 122 and the delayed audio signal is supplied to switch 118 via line 124. Delay line 122 delays the audio signal by an amount of time greater than the sum of: amplifier control signal lag, detector processing, and switch operation time. All of these times are in milliseconds or less, and so are undetectable to those listening to the audio from the loudspeaker. Delay line 122 may be a discrete component marketed for that purpose or may be any circuitry able to accomplish the same delay. Shutoff circuit 104 may be made of discrete components or may reside on a single chip. In a particular embodiment, delay circuit 122 may be a variable delay circuit, responsive to input 132, for the advantage of being able to tune for any of various microphones having respective delays.

If no microphone drop is detected in detector 114, delayed audio signal is supplied to amplifier 106 via line 126, and amplified audio is supplied to a loudspeaker connection at the housing 102. If a microphone drop is detected, switch 118 opens for the duration of the drop transient signal and amplifier 106 receives no input signal. In a particular embodiment, switch 118 may be configured to short the drop transient signal to ground or to a dummy load.

In a particular embodiment, detector circuit 114 may receive samples of the audio signal, rather than a microphone control signal, and may generate a shutoff signal based on sample amplitude, amplitude increase rate between samples, or both. In a particular embodiment, detector circuit 114 may be switchable, via input 130, between a first mode of responding to a microphone control signal and a second mode of responding to a sequence of samples of the audio signal. The advantage of dual mode operation is that the amplifier-based microphone shutoff system 100 may be used with microphones that provide amplifier control signals and microphones that do not provide amplifier control signals. Input 130 may be electronic or mechanical.

Figure 3:
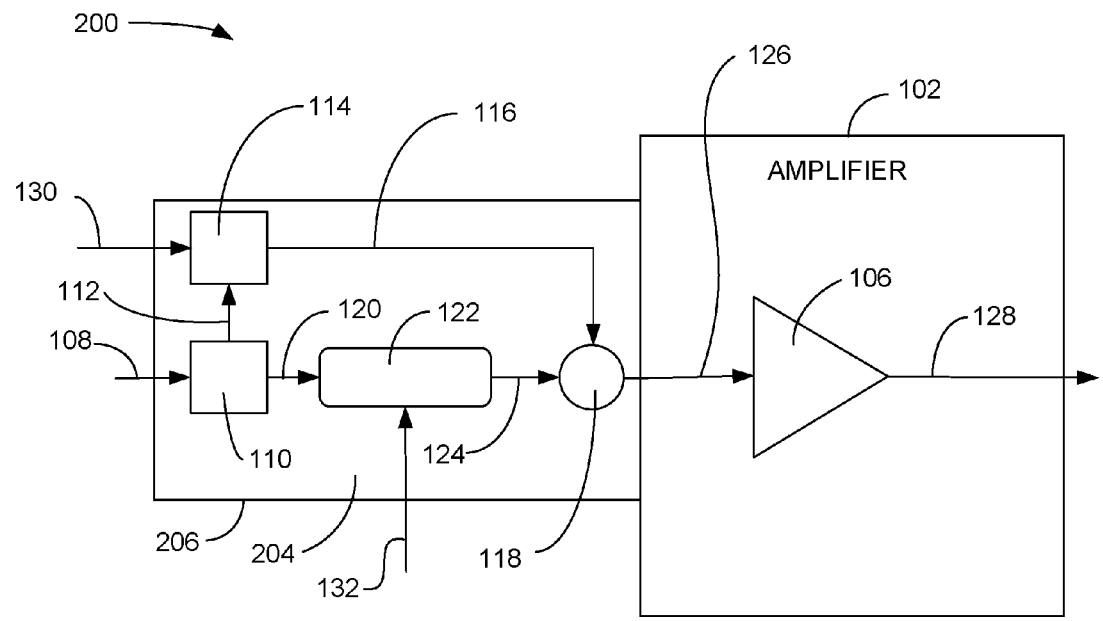
FIG. 3 is a diagrammatic view illustrating a second exemplary embodiment of the amplifier-based microphone shutoff system, according to a preferred embodiment of the present invention.

FIG. 3 is diagrammatic view illustrating a second exemplary embodiment of the amplifier-based microphone shutoff system 200, according to a preferred embodiment of the present invention. Shutoff circuit 204 may be a discrete component in a housing 206 that is plugged into the outside of amplifier housing 102, by plugging into an audio signal input jack on the amplifier housing 102 and providing an input jack 408 (see FIG. 4) for microphone input. The advantage of this is that shutoff circuit 204 can be used with legacy amplifiers. Those of skill in the art, enlightened by the present disclosure, will be aware of ways to divide the functional parts 110, 114, 118, and 122 between circuits that are interior to the amplifier housing 102 and those that are exterior to the amplifier housing 102, all of which are within the scope of the present invention.

Figure 4:
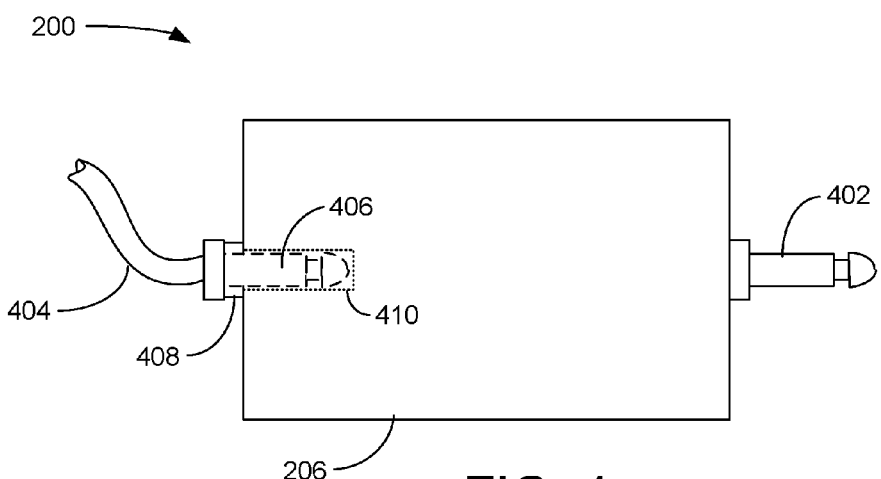
FIG. 4 is a diagrammatic view illustrating the second exemplary embodiment of the amplifier-based microphone shutoff system of FIG. 3, according to a preferred embodiment of the present invention.

FIG. 4 is a diagrammatic view illustrating the second exemplary embodiment of the amplifier-based microphone shutoff system 200 of FIG. 3, according to a preferred embodiment of the present invention. Microphone-type plug 402 extends from shutoff circuit housing 206 to plug into the amplifier housing 102 like any microphone. Microphone plug 406, coupled to a microphone by microphone cable 404 is inserted into microphone jack 408 to make internal electrical contacts in an inner portion 410 of the microphone jack 408. In a particular embodiment, microphone jack 408 may be replaced with a wireless receiver for use with wireless microphones.

Figure 5:
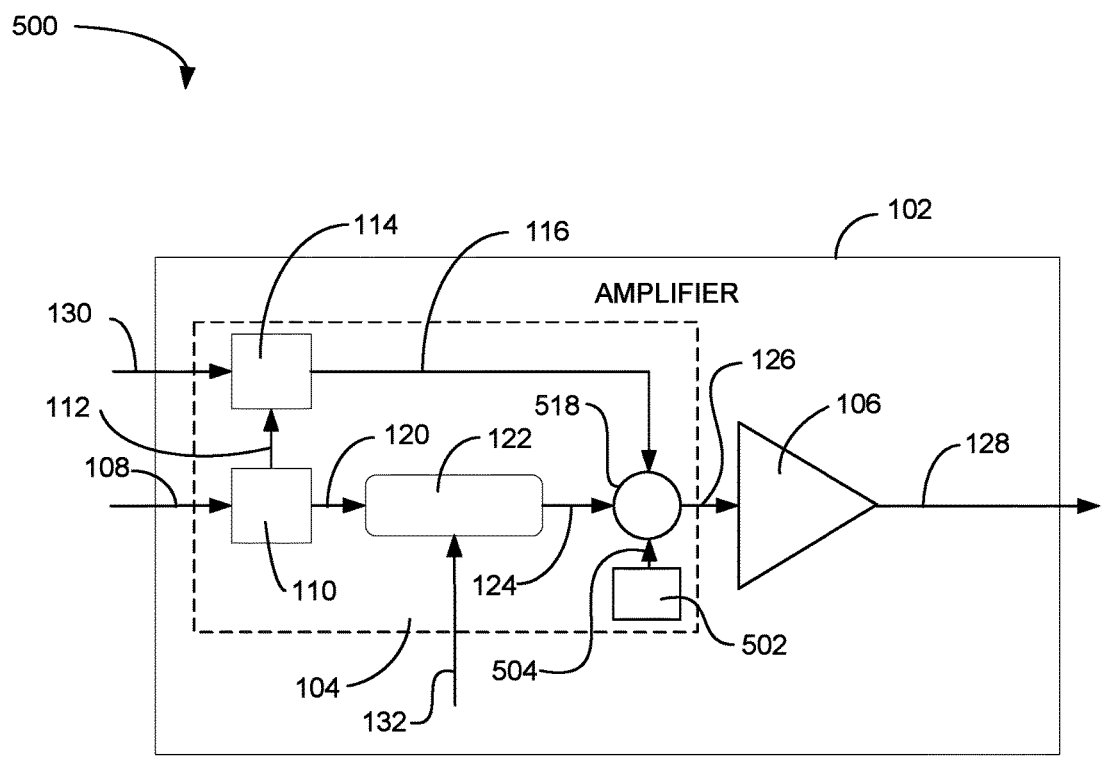
FIG. 5 is a diagrammatic view illustrating a third exemplary embodiment of the amplifier-based microphone shutoff system, according to a preferred embodiment of the present invention.

FIG. 5 is a diagrammatic view illustrating a third exemplary embodiment of the amplifier-based microphone shutoff system 500, according to a preferred embodiment of the present invention. Amplifier-based microphone shutoff system 500 has a digital memory 502 storing an audio signal that may be coupled, via line 504, through switch 518 and into amplifier 106 when a microphone drop is detected. The amplitude of the stored audio is predetermined to be safe for the amplifier 106 and any loudspeaker connected thereto. The stored audio may simulate a microphone drop, at a safe predetermined amplitude; or may produce any other predetermined entertaining sound at a safe amplitude. In a particular embodiment, a plurality of sounds may be stored and played in random, selected, or sequential order, using known techniques for reading digital memory.

I claim:

1. An amplifier-based microphone shutoff system comprising:
   a. a separator circuit that is:
      i. one of inside an amplifier housing and coupled to an exterior of said amplifier housing; and
      ii. operable to separate an audio signal from a microphone from a second signal from said microphone;
   b. a detector circuit that is:
      i. one of inside said amplifier housing and attached to an exterior of said amplifier housing;
      ii. operable to detect said second signal; and
      iii. adapted to generate a shut off signal responsive to said second signal;
   c. a switch that is:
      i. one of inside said amplifier housing and attached to an exterior of said amplifier housing; and
      ii. responsive to said shut off signal to shut off an audio signal path to an amplifier; and
   d. a delay circuit that is:
      i. one of inside said amplifier housing and attached to an exterior of said amplifier housing;
      ii. operable to delay said audio signal for a duration greater than a cumulative time required for said separator circuit, said detector circuit, and said switch to operate.

2. The amplifier-based microphone shutoff system of claim 1, comprising said amplifier within said amplifier housing, wherein said amplifier provides an amplified audio output for driving a loudspeaker.

3. The amplifier-based microphone shutoff system of claim 1, wherein said second signal comprises an amplifier control signal originating in said microphone.

4. The amplifier-based microphone shutoff system of claim 1, wherein said second signal comprises a sequence of samples of said audio signal.

5. The amplifier-based microphone shutoff system of claim 1, wherein said detector circuit comprises a demultiplexer.

6. The amplifier-based microphone shutoff system of claim 1, wherein said delay circuit comprises a variable delay circuit.

7. The amplifier-based microphone shutoff system of claim 1, comprising a digital memory having at least one stored audio signal at a predetermined amplitude, wherein said switch is adapted, responsive to receiving said shutoff signal, to communicate said at least one stored audio signal to said amplifier.

8. The amplifier-based microphone shutoff system of claim 1, wherein said separator circuit, said detector circuit, said switch, and said delay circuit comprise a single physical unit.

9. The amplifier-based microphone shutoff system of claim 8, wherein said single physical unit further comprises:
   a. a shutoff circuit housing;
   b. a microphone plug extending from said shutoff circuit housing and adapted to plug into said amplifier housing; and
   c. a microphone socket supported on said shutoff circuit housing and adapted to receive a microphone plug that is coupled to said microphone.

10. The amplifier-based microphone shutoff system of claim 1, wherein said detector circuit comprises a circuit switchable between:
   a. a first mode adapted to respond to a microphone-generated amplifier control signal; and
   b. a second mode adapted to respond to a sequence of samples of said audio signal.

11. An amplifier-based microphone shutoff system comprising:
   a. a separator circuit that is:
      i. one of inside an amplifier housing or coupled to an exterior of said amplifier housing; and
      ii. operable to separate an audio signal from a microphone from a second signal from said microphone;
   b. a detector circuit that is:
      i. one of inside said amplifier housing or attached to an exterior of said amplifier housing;
      ii. operable to detect said second signal; and
      iii. adapted to generate a shut off signal responsive to said second signal;
   c. a switch that is:
      i. one of inside said amplifier housing or attached to an exterior of said amplifier housing; and
      ii. responsive to said shut off signal to shut off an audio signal path to an amplifier;
   d. a delay circuit that is:
      i. one of inside said amplifier housing or attached to an exterior of said amplifier housing; and
      ii. operable to delay said audio signal for a duration greater than a cumulative time required for said separator, said detector, and said switch to operate; and
   e. wherein said second signal comprises at least one of:
      i. an amplifier control signal originating in said microphone; and
      ii. a sequence of samples of said audio signal.

12. The amplifier-based microphone shutoff system of claim 11, wherein said detector circuit comprises a circuit switchable between:
   a. a first mode adapted to respond to a microphone generated amplifier control signal; and b. a second mode adapted to respond to a sequence of samples of said audio signal.

13. The amplifier-based microphone shutoff system of claim 11, wherein said delay circuit comprises a variable delay circuit.

14. The amplifier-based microphone shutoff system of claim 11, wherein said separator circuit, said detector circuit, said switch, and said delay circuit comprise a single physical unit.

15. The amplifier-based microphone shutoff system of claim 14, wherein said single physical unit further comprises:
   a. a shutoff circuit housing;
   b. a microphone plug extending from said shutoff circuit housing and adapted to plug into said amplifier housing; and
   c. a microphone socket supported on said shutoff circuit housing and adapted to receive a microphone plug that is coupled to said microphone.

16. The amplifier-based microphone shutoff system of claim 11, comprising a digital memory having at least one stored audio signal at a predetermined amplitude, wherein said switch is adapted, responsive to receiving said shutoff signal, to communicate said at least one stored audio signal to said amplifier.

17. The amplifier-based microphone shutoff system of claim 11, wherein said detector circuit comprises a demultiplexer.

18. An amplifier-based microphone shutoff system comprising:
   a. a separator circuit that is:
      i. one of inside an amplifier housing and coupled to an exterior of said amplifier housing; and
      ii. operable to separate an audio signal from a microphone from a second signal from said microphone;
   b. a detector circuit that is:
      i. one of inside said amplifier housing and attached to an exterior of said amplifier housing;
      ii. operable to detect said second signal; and
      iii. adapted to generate a shut off signal responsive to said second signal;
      iv. wherein said detector circuit comprises a circuit switchable between:
         1. a first mode adapted to respond to a microphone generated amplifier control signal; and
         2. a second mode adapted to respond to a sequence of samples of said audio signal;
   c. a switch that is:
      i. one of inside said amplifier housing and attached to an exterior of said amplifier housing, respectively; and
      ii. responsive to said shut off signal to shut off an audio signal path to an amplifier;
   d. a delay circuit that is:
      i. one of inside said amplifier housing or attached to an exterior of said amplifier housing, respectively; and
      ii. operable to delay said audio signal for a duration greater than the cumulative time required for said separator circuit, said detector circuit, and said switch to operate;
      iii. wherein said delay circuit comprises a variable delay circuit; and
   e. wherein said second signal comprises at least one of:
      i. an amplifier control signal originating in said microphone; and
      ii. a sequence of samples of said audio signal.

19. The amplifier-based microphone shutoff system of claim 18, wherein said separator circuit, said detector circuit, said switch, and said delay circuit comprise a single physical unit comprising:
   a. a shutoff circuit housing;
   b. a microphone plug extending from said shutoff circuit housing and adapted to plug into said amplifier housing; and
   c. a microphone socket supported on said shutoff circuit housing and adapted to receive a microphone plug that is coupled to said microphone.

20. The amplifier-based microphone shutoff system of claim 18, comprising a digital memory having at least one stored audio signal at a predetermined amplitude, wherein said switch is adapted, responsive to receiving said shutoff signal, to communicate said at least one stored audio signal to said amplifier.

* * * * *